United States Patent
Ju et al.

(10) Patent No.: US 6,169,009 B1
(45) Date of Patent: Jan. 2, 2001

(54) METHODS OF ETCHING PLATINUM GROUP METAL FILM AND FORMING LOWER ELECTRODE OF CAPACITOR

(75) Inventors: Byong-sun Ju; Hyoun-woo Kim, both of Seoul; Chang-jin Kang, Kyunki-do; Joo-tae Moon, Kyungki-do; Byeong-yun Nam, Kyungki-do, all of (KR)

(73) Assignee: Samsung Electronics Co., Ltd., Kyungki-Do (KR)

(*) Notice: Under 35 U.S.C. 154(b), the term of this patent shall be extended for 0 days.

(21) Appl. No.: 09/203,337

(22) Filed: Dec. 2, 1998

(30) Foreign Application Priority Data

May 28, 1998 (KR) .................................. 98-19477

(51) Int. Cl.⁷ .................................. H01L 21/20
(52) U.S. Cl. .................. 438/396; 438/706; 438/717; 438/722; 438/725
(58) Field of Search ..................... 438/393, 396, 438/399, 706, 713, 717, 720, 722, 725, 742

(56) References Cited

U.S. PATENT DOCUMENTS

| | | | |
|---|---|---|---|
| 4,566,026 | * 1/1986 | Lee et al. | 257/751 |
| 4,832,787 | * 5/1989 | Bondur et al. | 216/18 |
| 5,126,008 | * 6/1992 | Levy | 438/720 |
| 5,472,564 | * 12/1995 | Nakamura et al. | 216/51 |
| 5,696,015 | * 12/1997 | Hwang | 438/253 |
| 5,702,970 | * 12/1997 | Choi | 438/3 |
| 5,936,296 | * 8/1999 | Park et al. | 257/529 |
| 5,972,722 | * 10/1999 | Visokay et al. | 438/3 |
| 6,004,882 | * 12/1999 | Kim et al. | 438/706 |
| 6,008,141 | * 12/1999 | Ibara et al. | 438/754 |

FOREIGN PATENT DOCUMENTS

9-260354  10/1997  (JP).

OTHER PUBLICATIONS

Abstract of Japanese Patent Publication No. 9–293838, Nov. 11, 1997.

Abstrace of Japanese Patent Publication No. 2–84734, Mar. 6, 1990.

Abstract of Japanese Patent Publication No. 8–181126, Jul. 12, 1996.

Abstract of Japanese Patent Publication No. 8–181086, Jul. 12, 1996.

* cited by examiner

*Primary Examiner*—Carl Whitehead, Jr.
*Assistant Examiner*—Jamie L. Davis
(74) *Attorney, Agent, or Firm*—Jones Volentine, L.L.C.

(57) ABSTRACT

A method of etching a platinum group metal film uses a gas mixture containing argon (Ar), oxygen ($O_2$) and halogen gases and a method of forming a lower electrode of a capacitor uses the etching method. The gas mixture contains $O_2$, Ar, and a third component, preferably a halogen, e.g., chlorine ($Cl_2$) or hydrogen bromide (HBr). In the method of forming a lower electrode, a conductive film containing a metal belonging to a platinum (Pt) group is formed on a semiconductor substrate, a hard mask partially exposing the conductive film is then formed on the conductive film. Then, the exposed conductive film is dry-etched using the hard mask as an etching mask and a three-component gas mixture containing argon (Ar) and oxygen ($O_2$), to form a conductive film pattern beneath the hard mask, and the hard mask is then removed.

6 Claims, 2 Drawing Sheets

METHODS OF ETCHING PLATINUM GROUP METAL FILM AND FORMING LOWER ELECTRODE OF CAPACITOR

CROSS-REFERENCES TO RELATED APPLICATIONS

The present application claims priority under 35 U.S.C. §119 to Korean Patent Application No. 98-19477 filed on May 28, 1998, the entire contents of which are hereby incorporated by reference.

BACKGROUND OF THE INVENTION

1. Field of the Invention

The present invention relates to a method of manufacturing a semiconductor memory device, and more particularly, to a method of etching a film formed of a metal belonging to a platinum (Pt) group, and a method of forming a lower electrode of a capacitor.

2. Description of the Related Art

In order to make a highly integrated dynamic random access memory (DRAM), methods of thinning the dielectric film of a capacitor, or using a three-dimensional structure for the lower electrode capacitor, have been suggested in order to increase capacitance within a limited cell area.

However, even though the above methods are adopted, it is difficult to obtain the capacitance required for operating a DRAM memory device of 1 Gigabit or more using a conventional dielectric material. Thus, to solve the above problems, much research has been conducted into replacing a dielectric film with a thin film having a high dielectric constant such as $(Ba,Sr)TiO_3$ (abbreviated BST), $PbZrTiO_3$ (abbreviated PZT), $(Pb,La)(Zr,Ti)O_3$ (abbreviated PLZT).

When using a high dielectric material such as BST in a DRAM, after forming a buried contact using a conductive plug formed of doped polysilicon, a lower electrode is formed thereon and then a dielectric material is deposited in order to form a capacitor.

In the case of the capacitor adopting the above high dielectric film, platinum (Pt) group metals or oxides thereof, e.g., platinum (Pt), iridium (Ir), iridium oxide ($IrO_2$), ruthenium (Ru) or ruthenium oxide ($RuO_2$), are used as an electrode material. In order to pattern a conductive film formed of such Pt group metals or oxides thereof, a sputtering method has been adopted. However, when etching the above conductive film by the sputtering method, polymer residue is produced, which causes slanted side walls of the electrodes. Thus, it is difficult to form a fine pattern.

Therefore, when etching the conductive film to form electrodes, the conductive film has been etched using a plasma containing plenty of oxygen, based on the fact that the material forming an etching mask is hardly etched by the plasma containing abundant oxygen.

However, when viewing the lower electrode, that is, the storage electrode, of the capacitor at the top, the width of a space between each node is different in the long- and short-axes. If the length of each node in the long-axis direction is very different from that in the short-axis direction, the etching rate becomes even higher in the long-axis direction than in the short-axis direction. In the memory device of 1 Gigabit or more, each node is very small, and the pitch of the nodes is also very tiny. Thus, a difference in etching rates as described above causes defects in the memory device above 1 Gigabit. In other words, when etching the conductive film, it is comparatively easy to separate each electrode pattern in the long-axis direction of the electrode while the electrode patterns are not completely separated in the short-axis direction.

Also, because the etching mask used for patterning the electrode is very thin in the memory device of 1 Gigabit, erosion of the etching mask occurs before the conductive film is completely etched. If etching is continued using the eroded etching mask, slant at the side walls of the obtained conductive pattern diverges from the allowable range, so it is difficult to separate the adjacent conductive film patterns.

SUMMARY OF THE INVENTION

The present invention is therefore directed to a method of etching a film and to a method of forming a lower electrode of a capacitor of a highly integrated memory which substantially overcomes one or more of the problems due to the limitations and disadvantages of the related art.

To solve the above problems, it is an objective of the present invention to provide a method of effectively etching an electrode film formed of a metal belonging to a platinum (Pt) group.

It is another objective of the present invention to provide a method of forming a lower electrode of a capacitor of a highly integrated semiconductor memory device, capable of completely separating each node even though the nodes have very fine pitch, by reducing a difference in etching rate caused by difference in width of space in the long- and short-axes of an electrode.

Accordingly, to achieve the above first objective, there is provided a method of etching a material film formed of a metal belonging to a platinum (Pt) group by a dry etching using a predetermined etching gas, wherein the etching gas is a gas mixture containing argon (Ar), oxygen ($O_2$) and halogen.

Preferably, the material film is formed of one selected from the group consisting of metals belonging to the Pt group oxides of metals belonging to the Pt group, and mixtures thereof. For example, the material film is formed of platinum (Pt), iridium (Ir), iridium oxide ($IrO_2$), ruthenium (Ru), ruthenium oxide ($RuO_2$), or mixtures thereof.

Preferably, the material film is etched after a mask pattern containing titanium (Ti) is formed on the material film. Preferably, the mask pattern is formed of Ti or TiN.

Preferably, the etching gas is a gas mixture containing oxygen ($O_2$), chloride ($Cl_2$) and argon (Ar), or a gas mixture containing oxygen ($O_2$), hydrogen bromide (HBr) and argon (Ar).

Preferably, the etching gas contains 70% or more $O_2$ based on the volume of the gas mixture.

Preferably, the etching gas contains 3~20% or more $Cl_2$ or HBr based on the volume of the gas mixture.

Preferably, the etching gas contains 3~20% or more Ar based on the volume of the gas mixture.

To achieve the second objective, there is provided a method of forming a lower electrode of a capacitor, including: forming a conductive film containing a metal belonging to a platinum (Pt) group on a semiconductor substrate; forming a hard mask on the conductive film, the hard mask partially exposing the conductive film; dry etching the exposed conductive film using the hard mask as an etching mask and a three-component gas mixture containing argon (Ar) and oxygen ($O_2$) as an etching gas, to form a conductive film pattern beneath the hard mask; and removing the hard mask.

Preferably, the conductive film is formed of one selected from the group consisting of metals belonging to the Pt group, oxides of metals belonging to the Pt group, and mixtures thereof.

Preferably, forming the hard mask includes forming a single layer selected from one of Ti and TiN, or forming the hard mask includes forming two layers, including forming a first pattern from one of Ti and TiN and forming a second pattern from one of silicon oxide and photoresist.

Preferably, in the etching includes using one of a gas mixture containing oxygen ($O_2$), chloride ($Cl_2$) and argon (Ar) and a gas mixture containing oxygen ($O_2$), hydrogen bromide (HBr) and argon (Ar).

Preferably, the etching gas contains 70% or more $O_2$ based on the volume of the gas mixture.

Preferably, the etching gas contains 3~20% or more $Cl_2$ or HBr based on the volume of the gas mixture.

Preferably, the etching gas contains 3~20% or more Ar based on the volume of the gas mixture.

Preferably, the etching includes using magnetically-enhanced reactive ion etching (MERIE). Here, a dual radio frequency (RF) power source may be used.

Preferably, in the removing of the hard mask includes using a dry etching method using a two-component gas mixture containing oxygen ($O_2$) and fluoride ($F_2$) as an etching gas.

Preferably, the etching gas is a gas mixture containing $O_2$ and carbon tetrafluoride ($CF_4$), $O_2$ and sulfur hexafluoride ($SF_6$), or $O_2$ and $CHF_3$.

Preferably, the semiconductor substrate includes a conductive plug connected to an active region of the semiconductor substrate, and the method further includes forming a barrier film on the conductive plug before forming the conductive film, and forming the conductive film on the barrier film.

Preferably, the forming the barrier film includes selecting one of TiN, TiSiN, TiAlN and TaSiN.

Preferably, when forming the conductive film pattern, the barrier film is partially exposed by the conductive film pattern, and the method further includes removing the exposed portion of the barrier film simultaneously with the hard mask.

Preferably, the removing of the hard mask and the exposed portion of the barrier film includes dry etching using a two-component gas mixture containing $O_2$ and F as an etching gas.

According to the present invention, the difference of etching rate according to the difference of space width in the long- and short-axes directions of the lower electrode is reduced, so the lower electrodes are smoothly separated in the short-axis direction as well as the long-axis direction when etching a conductive film to form the lower electrodes. Also, before the conductive pattern is formed, erosion of the etching mask is minimized, thereby forming lower electrodes within the allowable range of slant at the side walls. Also, after forming the lower electrodes, an adhesive film pattern and a barrier film can be etched without damage to the lower electrodes.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
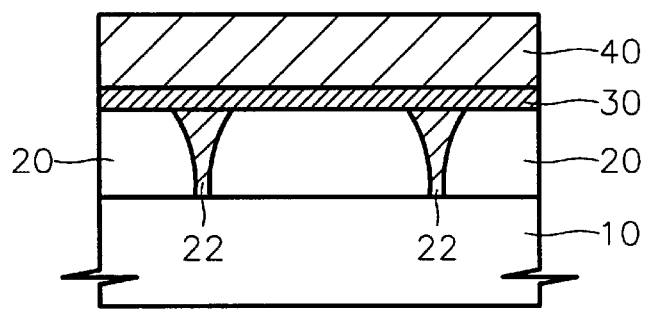
FIGS. 1 through 5 are section views illustrating a method of forming lower electrodes of a capacitor of a semiconductor memory device according to a preferred embodiment of the present invention.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

Referring to FIG. 1, after an interlayer dielectric (ILD) film 20 on a semiconductor substrate 10 is partially etched to form a contact hole, the contact hole is filled with a conductive material, e.g., doped polysilicon, to form a conductive plug 22 which is electrically connected to an active region of the semiconductor substrate 10. Then, a barrier film 30 is formed on the surface of the ILD film 20 and the conductive plug 22. The barrier film 30 prevents mutual diffusion of the conductive plug 22 and the lower electrode material formed in the following process, and is formed of TiN, TiSiN, TiAlN or TaSiN. Then, a metal silicide film (not shown) is formed between the conductive plug 22 and the barrier film 30 through annealing.

Then, a metal belonging to a Pt group or an oxide thereof, or a mixture thereof, is deposited on the barrier film 30 to form a conductive film 40. For example, the conductive film 40 may be formed of Pt, iridium (Ir), iridium oxide ($IO_2$), ruthenium (Ru) or ruthenium oxide ($RuO_2$).

Figure 2:
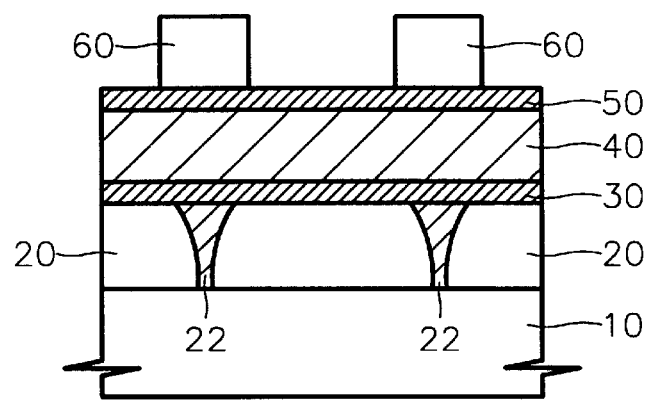

Referring to FIG. 2, an adhesive film 50 is formed on the conductive film 40. The adhesive film 50 increases adhesion between the conductive film 40 and a mask film formed of oxide in the following process. The adhesive film 50 is preferably formed of titanium (Ti) or a compound containing Ti, e.g., TiN. Then, a silicon oxide film is formed on the adhesive film 50 and patterned by a photolithography process, to form mask patterns 60 partially exposing the adhesive film 50.

Figure 3:
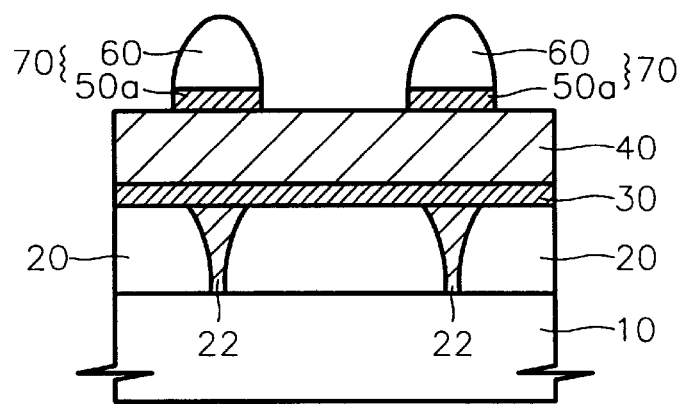

Referring to FIG. 3, the adhesive film 50 is etched using the mask pattern 60 as an etching mask, by a dry etching method using Ar and $Cl_2$ gases, thereby forming adhesive film patterns 50a partially exposing the conductive film 40. During the etching process for forming the adhesive film patterns 50a, the mask patterns 60 may be partially worn away as shown in FIG. 3. As a result, a hard mask 70 including the adhesive film pattern 50a and the mask pattern 60 is formed.

In this embodiment, the hard mask 70 has a dual layered structure in which the adhesive film pattern 50a and the mask pattern 60 are sequentially stacked. However, the present invention is not limited to this structure. For example, the hard mask may be implemented as a single layer of the adhesive film pattern 50a, or as a dual layer in which the adhesive film pattern 50a and a photoresist film are stacked in sequence.

Figure 4:
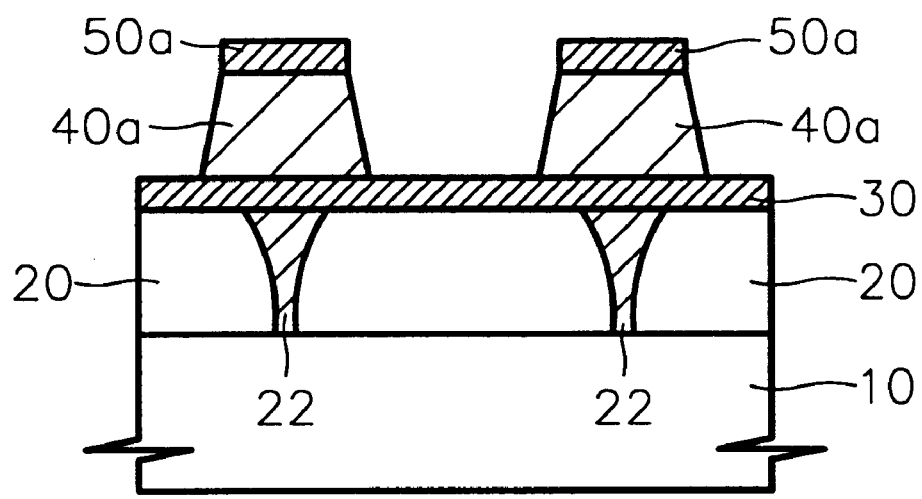

Referring to FIG. 4, the exposed portion of the conductive film 40 is dry etched using the hard mask 70 as an etching mask, preferably by magnetically-enhanced reactive ion etching (MERIE), resulting in conductive film patterns 40a beneath the hard mask 70. As a result, the barrier film 30 is partially exposed between the conductive film patterns 40a.

Here, a mixture of Ar, $O_2$ and halogen gases, e.g., a mixture of $O_2$, $Cl_2$ and Ar, or a mixture of $O_2$, hydrogen bromide (HBr) and Ar, are preferably used as an etching gas, and the $O_2$ content in the gas mixture is. preferably 70% or more, preferably, 80% or more, based on the volume of the gas mixture. That is, the content of $Cl_2$ and Ar, or HBr and Ar, in the gas mixture is preferably less than 30%, preferably 20% or less. Here, preferably, the content of HBr or $Cl_2$ in three-component gas mixture is 3~20% based on the volume of the gas mixture, and that of Ar is 3~20% based on the volume of the gas mixture.

The etching process preferably uses a dual radio frequency (RF) power source, which provides RF power by synthesizing two radio frequency (RF) power sources. For example, one of the RF power sources is 13.56 MHz/ 400~700 W, preferably, 13.56 MHz/500 W, and the other is 450 kHz/100~500 W, preferably, 450 kHz/300 W. The frequency of the latter RF power source may be within the range of 100~900 kHz.

During the etching process, the possible pressure range of a reaction chamber is 2~10 mtorr, and the possible temperature range of an electrode is 30~300° C. Preferably, the pressure of the reaction chamber is 6mtorr and the temperature of the electrode is 80° C.

As described above, when etching the conductive film 40 formed of a metal belonging to the Pt group or a Pt group metal oxide using the three-component gas mixture, titanium (Ti) forming the adhesive film pattern 50a is oxidized by $O_2$ contained in the etching gas, so the adhesive film pattern 50a is changed into a film which is hardly etched during the etching of the conductive film 40. Thus, the conductive film 40 can be etched using the adhesive film pattern 50a as a mask without forming residues, and the etching can be achieved without damage to the conductive film 40 even though the hard mask 70 is thin.

Also, Ar contained in the three-component gas mixture has a great sputtering tendency. Thus, during the etching process for forming the pattern having a fine pitch in the highly integrated device, Ar acts favorably, so the conductive film patterns 40a are clearly separated in the short-axis direction as well as the long-axis direction. Also, erosion of the adhesive film pattern 50a is minimized before the conductive film pattern 40a is formed, so the conductive film pattern 40a can be formed to have side walls slanted within an allowable range.

After the conductive film pattern 40a is obtained by etching the conductive film 40 to an etching end point, overetching is additionally performed for a predetermined duration, thereby completely removing the mask pattern 60. Here, the overetching time is typically within the range of 50~400% of the etching time required for etching the conductive film 40 to the end point. When etching the conductive film 40 under the above etching conditions, the mask pattern 60 formed of a silicon oxide film is removed together with the conductive film 40, while the adhesive film pattern 50a remains since it is oxidized to act as a mask.

Figure 5:
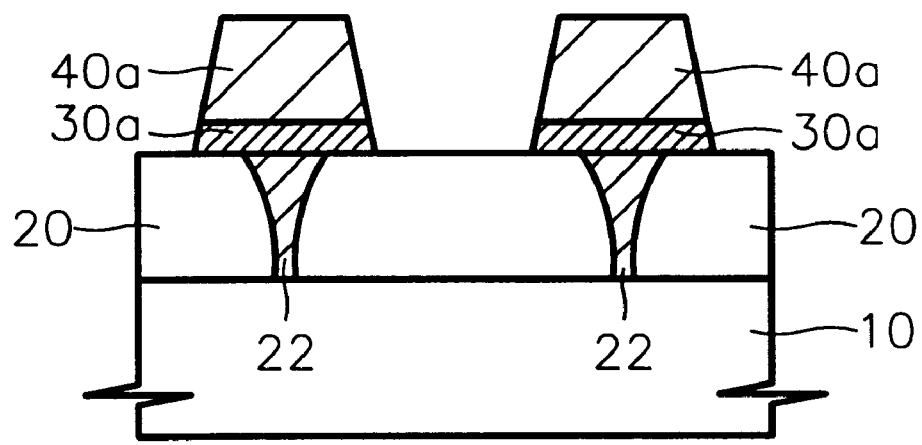

Referring to FIG. 5, while the adhesive film pattern 50a formed on the conductive film pattern 40a is removed, the barrier film 30 exposed between the conductive film patterns 40a is simultaneously etched by e.g., MERIE, resulting in barrier patterns 30a beneath the conductive film pattern 40a.

Here, a two-component gas mixture preferably containing $O_2$ and fluoride $F_2$, e.g., mixture of $O_2$ and carbon tetrafluoride ($CF_4$), $O_2$ and sulfur hexafluoride ($SF_6$), or $O_2$ and $CHF_3$, is used as an etching gas, and the $O_2$ content of each gas mixture is preferably 60~95% based on the volume of the gas mixture. When the adhesive film pattern 50a is etched using the above etching gas, Ti of the adhesive film pattern 50a and the barrier film 30 reacts with $O_2$ and F of the etching gas, to form a compound of $TiO_xF_y$, which is then vaporized. Thus, even though a low ion energy is applied during the MERIE etching, the adhesive film pattern 50a and the barrier film 30 can be effectively etched without damage to the conductive film pattern 40a.

During this etching process, an RF power source of, for example, 13.56 MHz/400 W is applied. Here, the pressure of the reaction chamber is preferably 20~40 mtorr, preferably, 35 mtorr, and the temperature of the electrode is preferably 30~120° C., preferably, 80° C.

Through the above-described processes, a lower electrode of a capacitor according to the present invention is formed, in which the conductive film pattern 40a is stacked on the barrier pattern 30a.

As described above, during the etching process for forming the conductive film patterns of a metal belonging to a Pt group or an oxide thereof, forming the lower electrodes, a three-component gas mixture containing $O_2$, HBr or $Cl_2$, and Ar is used as the etching gas, thereby reducing the difference of the etching rate caused from the difference of the space width in the long- and short-axes directions of the lower electrodes. As a result, when etching the conductive film to form the lower electrodes, the lower electrodes are smoothly separated in the short-axis direction as well as the long-axis direction.

Also, when etching the conductive film formed of a metal belonging to the Pt group or an oxide thereof using the three-component gas mixture, erosion of the etching mask before the conductive film pattern is formed can be minimized because the three-component gas mixture contains Ar which has a great sputtering tendency. As a result, lower electrodes have side walls slanted within an allowable range.

After etching the conductive film as described above, the two-component gas mixture containing $O_2$ and F is used to etch the adhesive film pattern used as a mask and the barrier film, so that Ti of the adhesive film pattern and barrier film, oxidized when etching the conductive film, reacts with $O_2$ and F to form a compound $TiO_xF_y$ to be vaporized. As a result, the adhesive film pattern and the barrier film can be etched without damage to the conductive film pattern 40a.

While the present invention has been illustrated and described with reference to a specific embodiment, further modifications and alterations within the spirit and scope of this invention will occur to those skilled in the art.

What is claimed is:

1. A method of forming a lower electrode of a capacitor, comprising:

forming a barrier film on the semiconductor substrate, the semiconductor substrate including a conductive plug connected to an active region of the semiconductor substrate, the barrier film including one of titanium nitride (TiN), titanium silicate nitride (TiSiN), titanium aluminum nitride (TiAlN) and tantalum silicate nitride (TaSiN);

forming a conductive film containing a metal on the barrier film, the conductive film being selected from a group consisting of platinum (Pt), iridium (Ir), iridium oxide ($IrO_2$), ruthenium (Ru), ruthenium oxide ($RuO_2$), and mixtures thereof, forming on the conductive film a hard mask partially exposing the conductive film, the hard mask including one of titanium (Ti) and TiN;

dry etching the exposed conductive film with a three-component gas mixture containing argon (Ar), oxygen ($O_2$) and chloride ($Cl_2$), using the hard mask as an etching mask to remove the exposed conductive film, partially expose the barrier film and form a conductive film pattern beneath the hard mask, the three-component gas mixture containing 70% or more $O_2$, at least 3–20% $Cl_2$ and at least 3–20% Ar based on volume of the three-component gas mixture; and dry etching the hard mask and the exposed barrier film using a two-component gas mixture containing $O_2$ and a fluoride, to remove the hard mask, the two-component gas mixture containing at least 60–95% $O_2$ based on volume of the two-component gas mixture.

2. The method of forming a lower electrode of a capacitor of claim 1, wherein the two-component gas mixture contains $O_2$ and one of carbon tetrafluoride, sulfur hexafluoride and $CHF_3$.

3. The method of forming a lower electrode of a capacitor of claim 1, wherein the hard mask comprises a first layer including one of Ti and TiN formed on the conductive film and an oxide layer formed on the first layer, the method further comprising:

overetching using the three-component gas mixture, after said dry etching of the exposed conductive film, to remove the oxide layer of the hard mask, said dry etching of the hard mask removing the first layer.

4. A method of forming a lower electrode of a capacitor, comprising:

forming a barrier film on the semiconductor substrate, the semiconductor substrate including a conductive plug connected to an active region of the semiconductor substrate, the barrier film including one of titanium nitride (TiN), titanium silicate nitride (TiSiN), titanium aluminum nitride (TiAlN) and tantalum silicate nitride (TaSiN);

forming a conductive film containing a metal on the barrier film, the conductive film being selected from a group consisting of platinum (Pt), iridium (Ir), iridium oxide ($IrO_2$), ruthenium (Ru), ruthenium oxide ($RuO_2$), and mixtures thereof, forming on the conductive film a hard mask partially exposing the conductive film, the hard mask including one of titanium (Ti) and TiN;

dry etching the exposed conductive film with a three-component gas mixture containing argon (Ar), oxygen ($O_2$) and hydrogen bromide (HBr), using the hard mask as an etching mask to remove the exposed conductive film, partially expose the barrier film and form a conductive film pattern beneath the hard mask, the three-component gas mixture containing at least 70% $O_2$, at least 3–20% HBr and at least 3–20% Ar based on volume of the three-component gas mixture; and dry etching the hard mask and the exposed barrier film using a two-component gas mixture containing $O_2$ and a fluoride, to remove the hard mask, the two-component gas mixture containing at least 60–95% $O_2$ based on volume of the two-component gas mixture.

5. The method of forming a lower electrode of a capacitor of claim 4, wherein the two-component gas mixture contains $O_2$ and one of carbon tetrafluoride, sulfur hexafluoride and $CHF_3$.

6. The method of forming a lower electrode of a capacitor of claim 4, wherein the hard mask comprises a first layer including one of Ti and TiN formed on the conductive film and an oxide layer formed on the first layer, the method further comprising:

overetching using the three-component gas mixture, after said dry etching of the exposed conductive film, to remove the oxide layer of the hard mask, said dry etching of the hard mask removing the first layer.

* * * * *